(12) United States Patent
Tsividis (10) Patent No.: US 8,207,784 B2
(45) Date of Patent: *Jun. 26, 2012

(54) METHOD AND APPARATUS FOR MOSFET DRAIN-SOURCE LEAKAGE REDUCTION

(75) Inventor: Yannis Tsividis, New York, NY (US)

(73) Assignee: Semi Solutions, LLC, Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/370,248

(22) Filed: Feb. 12, 2009

(65) Prior Publication Data
US 2009/0201081 A1  Aug. 13, 2009

Related U.S. Application Data

(60) Provisional application No. 61/064,036, filed on Feb. 12, 2008.

(51) Int. Cl.
*H03K 3/01* (2006.01)
(52) U.S. Cl. .......................... 327/534; 327/544
(58) Field of Classification Search .................. 327/534, 327/544
See application file for complete search history.

(56) References Cited

U.S. PATENT DOCUMENTS

| | | | |
|---|---|---|---|
| 5,079,605 A | 1/1992 | Blake | |
| 5,293,052 A | 3/1994 | Cherne et al. | |
| 5,587,667 A * | 12/1996 | Inami et al. | 326/17 |
| 5,644,266 A | 7/1997 | Chen et al. | |
| 5,729,037 A | 3/1998 | Hshieh et al. | |
| 5,821,769 A | 10/1998 | Douseki | |
| 5,994,177 A | 11/1999 | Wong et al. | |
| 6,034,563 A | 3/2000 | Mashiko | |
| 6,087,893 A | 7/2000 | Oowaki et al. | |
| 6,097,113 A * | 8/2000 | Teraoka et al. | 307/125 |
| 6,118,328 A | 9/2000 | Morikawa | |
| 6,165,846 A | 12/2000 | Carns et al. | |
| 6,191,615 B1 * | 2/2001 | Koga | 326/81 |
| 6,218,249 B1 | 4/2001 | Maa et al. | |
| 6,222,782 B1 * | 4/2001 | Chon | 365/189.09 |
| 6,225,827 B1 | 5/2001 | Fujii et al. | |
| 6,265,864 B1 * | 7/2001 | De Winter et al. | 324/207.2 |

(Continued)

FOREIGN PATENT DOCUMENTS

EP  0492991  6/1999

(Continued)

OTHER PUBLICATIONS

Sundararajan, V.; "Low Power Synthesis of Dual Threshold Voltage CMOS VLSI Circuits"; Feb. 1999; Dept. of ECE, Univ. of Minnesota, Twin Cities Campus.

(Continued)

*Primary Examiner* — Quan Tra
(74) *Attorney, Agent, or Firm* — Michael A. Glenn; Glenn Patent Group (57) ABSTRACT

A method and apparatus is taught for reducing drain-source leakage in MOS circuits. In an exemplary CMOS inverter, a first transistor causes the body of an affected transistor to be at a first body potential. A second transistor brings the body potential of the affected transistor to a second body potential by providing an accurate body voltage from a body voltage source. Exemplary body bias voltage sources are further described that can drive one or more gate transistors of different gate circuits.

22 Claims, 3 Drawing Sheets

U.S. PATENT DOCUMENTS

| | | |
|---|---|---|
| 6,291,857 B1 | 9/2001 | Hirano |
| 6,304,110 B1 | 10/2001 | Hirano |
| 6,343,045 B2 | 1/2002 | Shau |
| 6,373,753 B1 | 4/2002 | Proebsting |
| 6,384,639 B1 | 5/2002 | Chen et al. |
| 6,404,243 B1 * | 6/2002 | Koch et al. ............... 327/107 |
| 6,411,560 B1 | 6/2002 | Tanizaki et al. |
| 6,429,684 B1 | 8/2002 | Houston |
| 6,441,647 B2 | 8/2002 | Jeon |
| 6,462,584 B1 | 10/2002 | Proebsting |
| 6,465,849 B1 | 10/2002 | Chang et al. |
| 6,521,948 B2 | 2/2003 | Ebina |
| 6,556,408 B1 | 4/2003 | Zhang |
| 6,596,554 B2 | 7/2003 | Unnikrishnan |
| 6,621,292 B2 | 9/2003 | Sakata et al. |
| 6,628,551 B2 | 9/2003 | Jain |
| 6,643,199 B1 | 11/2003 | Tang et al. |
| 6,674,123 B2 | 1/2004 | Kim |
| 6,707,708 B1 | 3/2004 | Alvandpour et al. |
| 6,711,063 B1 | 3/2004 | Dejenfelt et al. |
| 6,711,088 B2 | 3/2004 | Hayashi et al. |
| 6,741,098 B2 | 5/2004 | Takahashi et al. |
| 6,744,301 B1 | 6/2004 | Tschanz et al. |
| 6,787,850 B1 | 9/2004 | Pelloie |
| 6,859,089 B2 | 2/2005 | Farley |
| 6,940,317 B2 | 9/2005 | Suga |
| 6,952,113 B2 | 10/2005 | Brown et al. |
| 6,958,519 B2 | 10/2005 | Gonzalez et al. |
| 6,977,519 B2 | 12/2005 | Bhavnagarwala et al. |
| 7,060,566 B2 | 6/2006 | Vogelsang |
| 7,079,413 B2 | 7/2006 | Tsukamoto et al. |
| 7,224,205 B2 | 5/2007 | Kapoor |
| 7,342,291 B2 | 3/2008 | Vogelsang |
| 7,436,221 B2 | 10/2008 | O'Halloran et al. |
| 7,474,125 B2 | 1/2009 | Kapoor |
| 7,714,638 B2 * | 5/2010 | Ryu et al. ............... 327/537 |
| 2001/0003513 A1 | 6/2001 | Shau |
| 2002/0096723 A1 | 7/2002 | Awaka |
| 2002/0154462 A1 | 10/2002 | Ker et al. |
| 2002/0195623 A1 | 12/2002 | Horiuchi |
| 2004/0227542 A1 | 11/2004 | Bhavnagarwala et al. |
| 2004/0239403 A1 | 12/2004 | Farley |
| 2005/0184794 A1 | 8/2005 | Armstrong et al. |
| 2005/0280083 A1 | 12/2005 | Vogelsang |
| 2006/0006479 A1 | 1/2006 | Kapoor |
| 2006/0006923 A1 | 1/2006 | Kapoor |
| 2006/0087362 A1 | 4/2006 | O'Halloran et al. |
| 2006/0189082 A1 | 4/2006 | Vogelsang |
| 2006/0151842 A1 | 7/2006 | Kapoor |
| 2006/0290416 A1 | 12/2006 | Florescu |
| 2007/0069306 A1 | 3/2007 | Kapoor et al. |
| 2007/0075743 A1 | 4/2007 | Oh |
| 2007/0170553 A1 | 7/2007 | Correale, Jr. et al. |
| 2007/0229145 A1 | 10/2007 | Kapoor et al. |
| 2007/0247213 A1 | 10/2007 | Kapoor |
| 2008/0142854 A1 | 6/2008 | Streif |
| 2008/0233685 A1 | 9/2008 | Kapoor |

FOREIGN PATENT DOCUMENTS

| | | |
|---|---|---|
| EP | 936664 | 8/1999 |
| EP | 1482640 | 12/2004 |
| WO | 86/01939 | 3/1986 |
| WO | WO 86/001939 | 3/1986 |
| WO | WO 2006/047268 | 5/2006 |
| WO | WO 2006/072094 | 7/2006 |
| WO | WO 2007/002418 | 1/2007 |
| WO | WO 2007/053485 | 5/2007 |
| WO | WO 2007/067684 | 6/2007 |
| WO | WO 2008/042843 | 4/2008 |

OTHER PUBLICATIONS

Kao, J.; "Dual-threshold Voltage Techniques for Low-Power Digital Circuits"; Jul. 2000; IEEE Journal of Solid-State Circuits, vol. 35, No. 7.

Thoidis, I.; "Design Methodology of Multiple-Valued Logic Voltage-Mode Storage Circuits"; 1998; IEEE.

Wei, L.; "Design and Optimization of Low Voltage High Performance Dual Threshold CMOS Circuits"; Jun. 1998; 35th Design Automation Conference, San Francisco, CA.

Anderson, J.; "Active Leakage Power Optimization for FPGAs"; Feb. 2004; FPGA '04, Monterey, CA.

Denison, M.; "Analysis and Modeling of DMOS FBSOA Limited by n-p-n Leakage Diffusion Current"; May 2005; Proceedings of the 17th Intl Symposium on Power Semiconductor Devices & ICs (IEEE Cat. No. 05CH37632), pp. 331-334, Santa Barbara CA.

Kotabe, A.; "A Low-Power Four-Transistor SRAM Cell with a Stacked Vertical Poly-Silicon PMOS and a Dual-Word-Voltage Scheme"; Apr. 2005; IEEE Journal of Solid-State Circuits, vol. 40, No. 4, pp. 870-876.

Mukhopadhyay, S.; "Modeling and Analysis of Gate Leakage in Ultra-thin Oxide Sub-50nm Double Gate Devices and Circuits"; Mar. 2005; Proceedings 6th Intl Symposium on Quality Electronic Design, pp. 410-415, IEEE Computer Society, San Jose, CA.

Terauchi, M.; "Analysis of Floating-Body-Induced Leakage Current in 0.15 mu m SOI DRAM"; Sep. 1996; 1996 IEEE Intl SOI Conference Proceedings (Cat. No. 35937) pp. 138-139, Sanibel Island, FL.

Srivastava, A.; "Simultaneous Vt Selection and Assignment for Leakage Optimization"; Aug. 2003; ISLPED'03, Seoul, Korea.

Gonzalez, R.; "Supply and Threshold Voltage Scaling for Low Power CMOS"; Aug. 1997; IEEE Journal of Solid-State Circuits, vol. 32, No. 8.

Thompson, S.; "MOS Scaling: Transistor Challenges for the 21st Century"; Q3 1998; Intel Technology Journal.

Kosonocky, S.V.; "Low-Power Circuits and Technology for Wireless Digital Systems"; Mar./May 2003; IBM J. Research & Development, vol. 47, No. 2/3.

Martin, S.; "Combined Dynamic Voltage Scaling and Adaptive Body Biasing for Lower Power Microprocessors under Dynamic Workloads"; 2002; University of Michigan, Dept. of ECE and ARM Ltd.

O'Connor, P.; "CMOS Preamplifier with High Linearity and Ultra Low Noise for X-Ray Spectroscopy"; 1997, Brookhaven National Laboratory, Upton, NY.

Halter, J.; "A Gate-Level Leakage Power Reduction Method for Ultra-Low-Power CMOS Circuits"; May 1997; ECE Dept. and Coordinated Science Lab., Univ. of Illinois at Urbana-Champaign, Urbana, IL.

Chandrakasan, A.; "Low Power CMOS Digital Design"; 1992; EECS Department; Univ. of California Berkely, CA.

Bohr, M., "High Performance Logic Technology and Reliability Challenges", IPRS, Intel, Apr. 1, 2003, 40 pages.

Borkar, S., "Circuit Techniques for Subthreshold Leakage Avoidance, Control, and Tolerance", IEEE, 0-7803-8684-1, Dec. 2004, 4 pages.

Cao, et al., "Reducing Dynamic Power and Leakage Power for Embedded Systems", 15th Annual IEEE International, vol. Uss, Sep. 2002, pp. 291-295.

Diaz, C.H. et al., "Device Properties in 90nm and beyond and implications on Circuit Design", IEEE, Dec. 2003, 4 pages.

Fallah, et al., "Standby and Active Leakage Current Control and Minimization in CMOS VLSI Circuits", EICE Trans. On Electronics, Special Section on Low-Power LSO and Low Power IP, vol. E88-c, No. 4., Apr. 2004, 21 pages.

Henzler, et al., "Fast Power-Efficient Circuit -Block Switch-Off Scheme", Electronics Letters, vol. 40. No. 2, Jan. 22, 2004, 2 pages.

Horiuchi, M., "A New Dynamic-Threshold SOI Device Having an Embedded Resistor and a Merged Body-Bias-Control Transistor", IEDM 1998, Dec. 1998, pp. 419-422.

Kawaguchi, et al., "Dynamic Cut-off Scheme for Low-Voltage SRAM's", Symposium on VLSI Circuits, Digest of Technical Papers, IEEE, Dec. 1998, pp. 140-141.

Kuroda, et al., "A 0.9-V, 150MHz, 10-mW, 4mm2, 2-D Discrete Cosine Transform Core Processor with Variable Threshold-Voltage (VT) Scheme", IEEE Journal of Solid-State Circuits, vol. 31, No. 11, Nov. 1996, pp. 1770-1779.

Min, et al., "Zigzag Super Cut-Off CMOS (ZSCCMOS) Block Activation with Self-Adaptive Voltage Level Controller: An alternative to Clock-Gating Scheme in Leakage Dominant Era", 2003 International Solid-State Circuits Conference, Digest of Technical Papers ISSCC, IEEE International, 0-7803-7707-9, Feb. 12, 2003, 10 pages.

Narendra, et al., "Full Chip Subthreshold Leakage Power Prediction and Reduction Techniques for sub-0.18um CMOS", IEEE Journal of Solid State Circuits, vol. 39, No. 2, Mar. 2004, pp. 510.

Rabaey, J., "Issues in Low Power Design—Managing Leakage", Dept. of Electrical Engineering and Computer Sciences, University of California at Berkeley, Aug. 23, 2004, 33 pages.

Takamiya, M. et al., "High Performance Electrically Induced Body Dynamic Threshold SOI MOSFET (EIB-DTMOS) with Large Body Effect and Low Threshold Voltage", IEDM Technical Digest, Dec. 1998, 4 pages.

Tschanz, et al., "Adaptive Body Bias for Reducing Impacts of Die-to-Die and within-die Parameter Variations on Microprocessor Frequency and Leakage, Solid State Circuits Conference", Digest of Technical Papers, ISSCC, 2002 IEEE International, vol. 1, Feb. 2002, 10 pages.

Von Arnim, et al., "Efficiency of Body Biasing in 90-nm CMOS for Low-Power Digital Circuits", IEEE Journal of Solid State Circuits, vol. 40, No. 7, Jul. 2005, pp. 1549-1556.

Vora, M. et al., "A 2 Micron High Performance Bipolar 64K ECL Static RAM Technology With 200 Square Microns Contactless Memory Cell", IEDM Technical Digest 1984, Dec. 1984, 690-693.

* cited by examiner

METHOD AND APPARATUS FOR MOSFET DRAIN-SOURCE LEAKAGE REDUCTION

CROSS REFERENCE TO RELATED APPLICATIONS

This patent application claims priority from U.S. provisional patent application 61/064,036, filed on Feb. 12, 2008, and which is incorporated herein in its entirety by this reference thereto.

BACKGROUND OF THE INVENTION

1. Technical Field

The invention relates generally to MOS circuits. More specifically, the invention relates to improving drain-source leakage in deep submicron MOS transistors.

2. Discussion of Related Art

The advantages of using dynamically adjustable threshold voltages in metal oxide semiconductor (MOS) transistors, with regard to enhancing drive-current or reducing leakage current, is known. Two general types of approaches are presently known in the art. One approach attempts to create a dynamic threshold voltage by using simple active or passive elements, such as diodes, resistors, and/or capacitors to cause such change of the threshold voltage. Another class of prior art solutions uses additional MOS transistors to control the threshold voltage in a manner that reduces leakage current.

U.S. Pat. Nos. 7,224,205, 6,521,948, and 5,821,769, teach inventions that make use of a diode for the purpose of controlling leakage in MOS transistors. These solutions, as well as others known in the art, are not fully compliant in one way or another with standard CMOS process flows. This is because a general MOS process flow does not allow the creation of diodes in the general active area, although diodes some are allowed at the pad region of an integrated circuit (IC). The design rules do not allow diodes because this is thought to prevent errors in the design that may cause the faulty operation of the IC, or even permanent damage to the IC. To enable such solutions as may control leakage, the design rules must be relaxed and, in some prior art solutions, changes to the process flow are also required.

U.S. Pat. Nos. 6,952,113, 6,744,301, 6,441,647, 6,304,110, 6,291,857, 6,118,328, 5,994,177, and 5,644,266 teach examples of solutions that use additional circuitry comprising MOS transistors to achieve reduced leakage of the MOS circuit. The MOS transistors that are controlled by these circuits connect the fourth terminal of the MOS transistor, i.e. the body, the other three terminals being the gate, source and drain, to an appropriate voltage to control the threshold voltage in a desired manner. Various solutions use a different number of transistors to control the leakage of the transistors and generally have a larger impact on a cell size than the first approach discussed above. These solutions have the advantage of not deviating from the standard process. They suffer, however, from various shortcomings, including an unpredictable body potential due to leakage currents and other factors, and a requirement for a direct current (DC) input draw.

There is a therefore a need in the art for a circuit which can reduce the drain-source leakage of MOS transistors and further overcome the deficiencies of prior art solutions.

SUMMARY OF THE INVENTION

A method and apparatus is taught for reducing drain-source leakage in MOS circuits. In an exemplary CMOS inverter, a first transistor causes the body of an affected transistor to be at a first body potential. A second transistor brings the body potential of the affected transistor to a second body potential by providing an accurate body voltage from a body voltage source. Exemplary body bias voltage sources are further described that can drive one or more gate transistors of different gate circuits.

DETAILED DESCRIPTION OF THE INVENTION

An embodiment of the invention provides a method and apparatus for reducing leakage in MOS circuits. In an exemplary CMOS inverter, a first transistor causes the body of a controlled transistor to be at a first body potential. A second transistor brings the body potential of the controlled transistor to a second body potential by providing an accurate body voltage from a body voltage source. Exemplary body voltage sources that can drive one or more gate transistors of different gate circuits are also described herein. Although CMOS circuits are emphasized as an example, the invention described herein is also applicable in technologies where only one transistor type is available, e.g. NMOS or PMOS.

Figure 1:
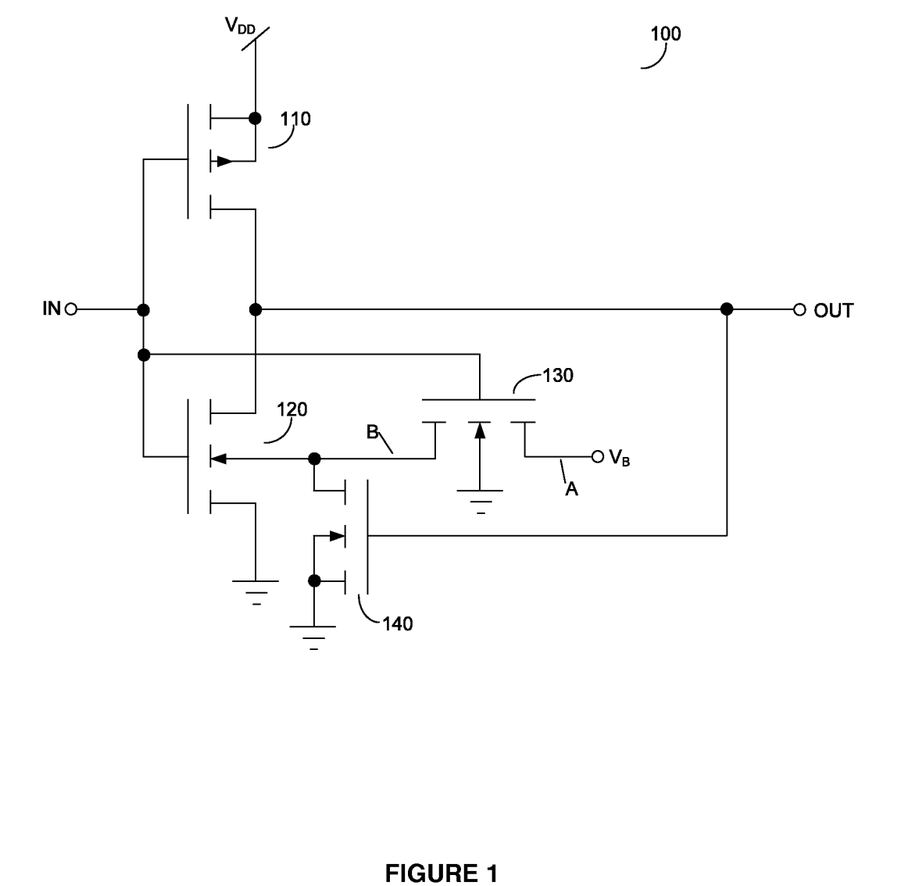
FIG. 1 is a schematic diagram of a circuit having leakage control in accordance with the invention.

FIG. 1 is a schematic diagram that shows a circuit 100 the implements leakage control in accordance with an embodiment of the invention. While the invention is described herein in the context of a complementary metal oxide semiconductor (CMOS) inverter, comprising a P-type MOS (PMOS) transistor 110 and an N-type MOS (NMOS) transistor 120, it will be apparent to those skilled in the art that the invention may be extended to other types of CMOS gates including, but not limited to, NAND, NOR, AND, OR, XOR, NXOR, AND-OR, and OR-AND gates.

A control circuit comprising a first NMOS transistor 130 and a second NMOS transistor 140 enhance the operation of a controlled NMOS transistor 120. Similarly, PMOS transistors (not shown) enhance the operation of PMOS transistor 110 in accordance with the invention. The first NMOS transistor 130 operates advantageously in the triode region when ON, thereby connecting the body of the controlled NMOS transistor 120 to a predetermined, typically positive voltage $V_B$, which is supplied by a separate circuit (not shown). The production of a voltage $V_B$ is explained in greater detail below. When the input at the terminal IN is high, the threshold voltage $V_T$ of the controlled NMOS transistor 120 is lowered, resulting in the enhancement of its ON current relative to what the current would have been if the body were at '0' potential. This is because, as is well known, the threshold voltage of NMOS transistors decreases when their body is made positive with respect to their source. Because the input terminal IN is high, the output terminal OUT is low, thus keeping the second NMOS transistor 140 in an OFF state. When the input at the IN terminal is low, the first NMOS transistor 130 is in an OFF state. In this case, the output terminal OUT goes high and causes the second NMOS transistor 140 to enter the ON state. This pulls the body of the controlled NMOS transistor 120 to low, resulting in its threshold voltage $V_T$ assuming its normal, zero-body-source voltage value, which is higher than its previous value. This value can be chosen through process engineering for low drain-source leakage current, and does not adversely affect the ON current due to the $V_T$ reduction in the ON state.

The ratio of the drain current in controlled NMOS transistor 120 with body bias to the value of that current without body bias is defined herein as the current enhancement ratio (CER). THE CER is denoted by the character a and is further discussed below with respect to the generation of the body voltage. First and second NMOS transistors 130 and 140, respectively, only need to conduct extremely small currents, so they can be minimum size if the parasitic capacitance they drive is not large. Thus, if the controlled NMOS transistor 120 is not a minimum-size transistor, the additional area needed to include the first and second NMOS transistors 130 and 140 is relatively small. Specifically, the disclosed invention is of particular benefit for large drivers, which consume much area and have a high total leakage current. The loop consisting of the controlled NMOS transistor 120 and the first NMOS transistor 130 provides a regenerative action. The circuit is preferably designed so that the positive feedback in that loop does not result in undesirable instability. In one embodiment of the invention, this action enhances the speed of the circuit 100 to some extent. To avoid positive feedback, the second NMOS transistor 140 could be replaced by another conductive path to ground. However, this may cause a DC current to flow through the first NMOS transistor 130 in the ON condition, thus defeating the purpose unless this current is extremely small.

In the more general case, more complex gates such as NAND or NOR gates may also benefit from the invention. Specifically, an equivalent transistor 140 is used to bring the body voltage of a controlled transistor to a first body voltage for the OFF state of the controlled transistor, for example transistor 120. A second transistor, such as transistor 130 is used to bring the body of the gate transistor, for example transistor 120, to a second body voltage at the ON state, thereby effectively causing the controlled transistor, for example transistor 120, to have two separate threshold voltages. The second body voltage is provided from an accurate body voltage source, as described herein in more detail below.

A person skilled in the art would readily appreciate that the disclosed circuit 100 uses only standard transistors, which are well characterized. No new design rules are needed, and no technology modifications are required, other than the threshold voltage $V_T$ adjustment, which is well known in the art. It will be further appreciated that the body of the controlled transistor 120 is not floating when the input terminal IN is low or high. Rather, it is reliably pulled to ground potential via the second NMOS transistor 140, or to the voltage $V_B$ via the first NMOS transistor 130. Thus, the body potential does not depend on unpredictable leakage currents. Furthermore, it will be appreciated that no DC input current drawn by application of the invention herein. A person skilled in the art would further realize that the body voltage can be made to have a reliable and appropriate value. Two exemplary and non-limiting body voltage circuits are described below.

Figure 2:
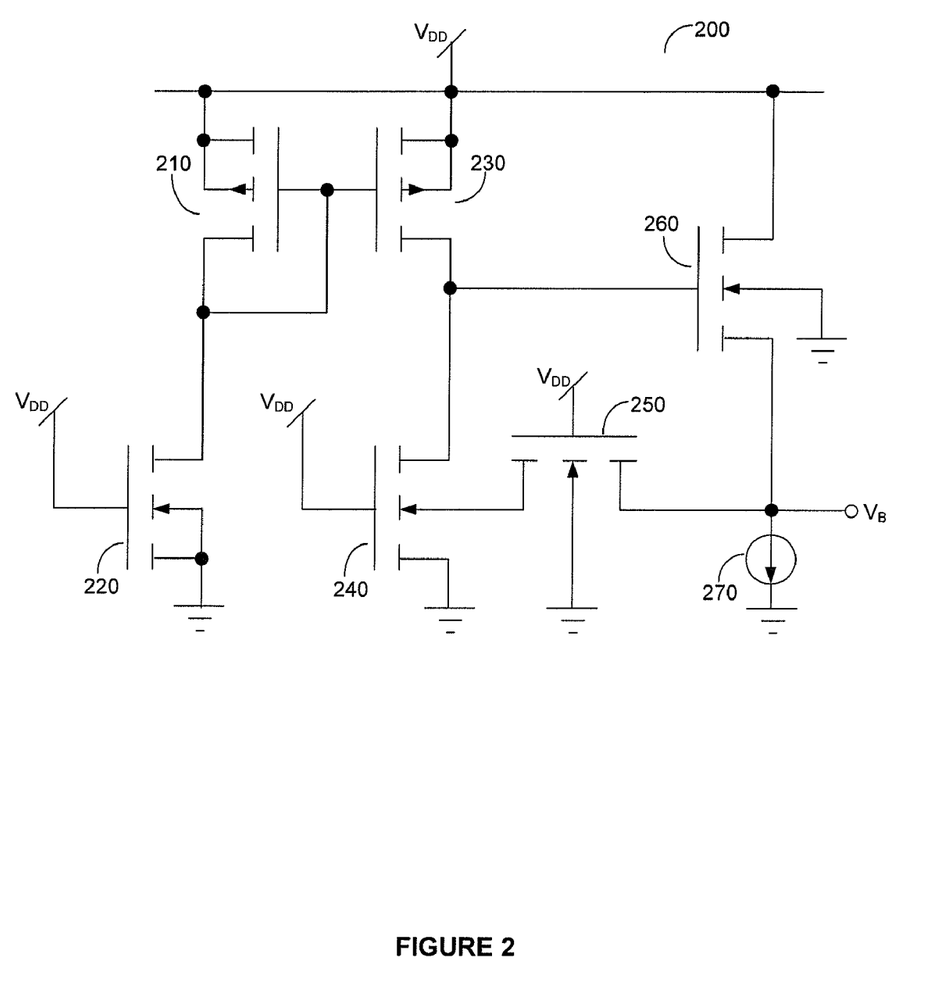
FIG. 2 is a schematic diagram of a first exemplary body voltage generator circuit for current leakage control in accordance with the invention.

FIG. 2 is a schematic diagram that shows a body voltage generator circuit 200 according to the invention. In the body voltage generator circuit 200, the body voltage of the transistor 240, i.e. the adaptive body bias device, is set to make its drain current $I_{D240}$ equal to a times the current the device would have if its body voltage were 0. It should be recalled that a is the CER defined above. All transistors, except for the transistor 250, are in saturation, and all currents and voltages and currents mentioned below are those that exist when these devices are steady, i.e. as opposed to when transients charging parasitic capacitances exist. For simplicity, the Early effect is neglected for purposes of the description of the body voltage generator circuit 200. The transistors 210 and 230 form a 1:1 current mirror. The transistor 220, which is the reference current device, and the transistor 240 have an equal channel length 'L', but the channel width 'W' of the transistor 220 is a>1 times the width of the transistor 240. For analysis purposes, it is assumed that the body of transistor 240 is initially at '0'. In this case it is determined that:

$$I_{D220}=a\times I_{D240}>I_{D240} \quad (1)$$

Because, $$I_{D230}=I_{D210}=I_{D220} \quad (2)$$

Then, $$I_{D230}>I_{D240} \quad (3)$$

resulting in an increase of the drain voltage $V_{D240}$ of the transistor 240. This increase is coupled by the source follower transistor 260, which is biased by the current source 270, to the body of the transistor 240 through the ON switch transistor 250. The increase in the body voltage $V_{B240}$ of the transistor 240 increases $I_{D240}$, until:

$$I_{D240}=I_{D230}=I_{D210}=I_{D220} \quad (4)$$

As a result, the body voltage $V_B$ attains a voltage value that is needed to make the drain current $I_{D240}$ with body bias equal to the drain current $I_{D220}$ without body bias, which is a times the current value $I_{D240}$ without body bias. Thus:

$$I_{D240} \text{ with body bias}=a\times I_{D240} \text{ without body bias} \quad (5)$$

The CER is set to the desired value a. The resulting voltage $V_B$ may be fed to one or more NMOS transistors elsewhere on the chip connected, for example, at the terminal marked $V_B$ in FIG. 1. The transistor 250 replicates the function of the first NMOS transistor 130 in FIG. 1 to assure good matching. The transistor 250 carries only a minute portion of the body current of the transistor 240. Because the transistor 240 is in the triode region, it has a rather small channel resistance and the voltage across it may be negligible. In that case, this device may be omitted. The feedback loop described above can be made more sensitive by inserting a voltage gain in the loop, for example at the input or the output of the source follower transistor 260.

The W/L ratios shown herein above are exemplary and are provided merely as an illustration of the principles of the invention. It will be apparent to those of ordinary skill in the art that ratios other than the above can be used. For example, the current mirror consisting of the transistors 210 and 230 can have a current ratio different than 1 if the sizes of the transistors 220 and 240 are appropriately altered to maintain the desired CER. The W/L ratios of the transistors should satisfy:

$$[(W/L)_{220}/(W/L)_{240}]\times[(W/L)_{230}/(W/L)_{210}]=a \quad (6)$$

The current sources can be implemented using transistors and the application of well-known design techniques.

The CER value a can be made programmable or tunable. For example, one or more of the four transistors 220, 210, 230, and 240 can be comprised of a plurality of transistors connected in parallel, some of which may be placed out of service as required by connecting their gates to their sources. This can be done, for example, by selecting the appropriate connections through electronic switches (not shown) an/or by digital control (not shown). Thus, the CER can be varied or tuned as required, for example but without limitation, responsive to process tolerances, temperature, and/or aging. Such CER variation can also be effected by injecting an appropriate current at the common drain node between the transistors 220 and 210 or the transistors 230 and 240, this current being an appropriate function of process tolerances, temperature, and aging, as required.

Figure 3:
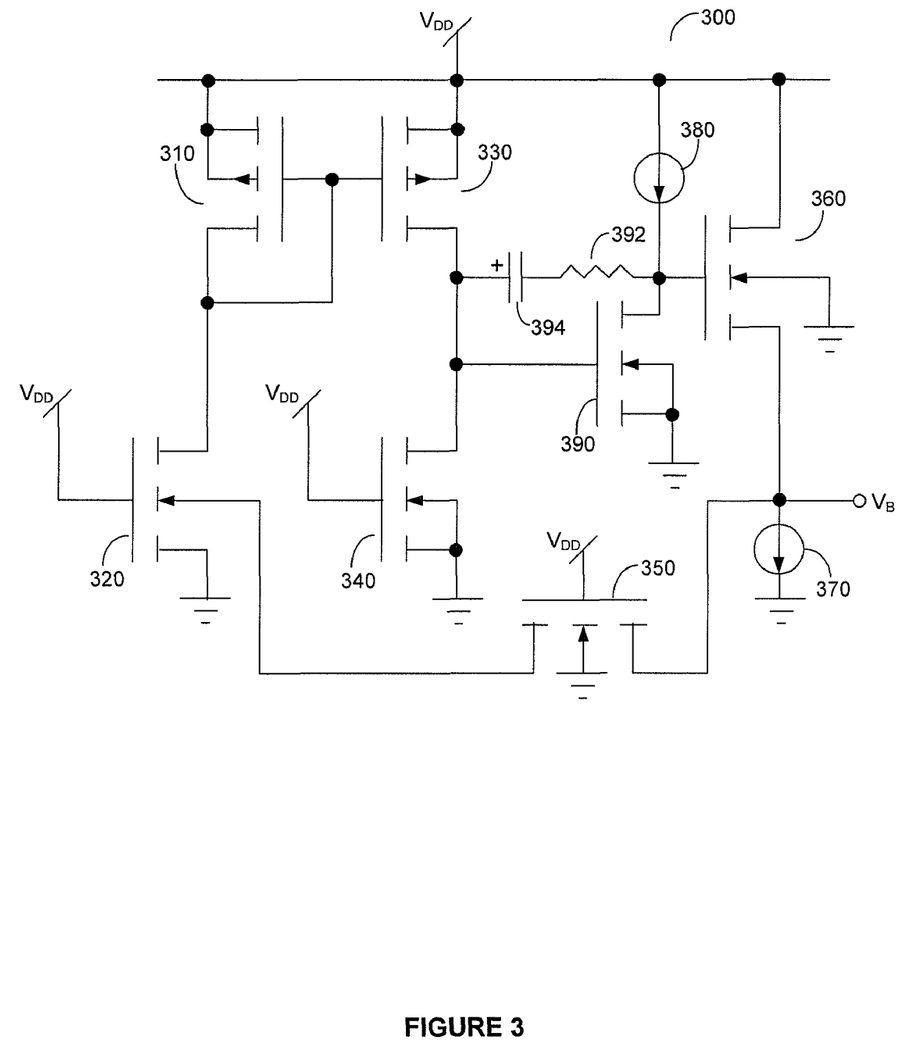
FIG. 3 is a schematic diagram of a second exemplary body voltage generator circuit for current leakage control in accordance with the invention.

FIG. 3 is a schematic diagram that shows another embodiment of a body voltage generator circuit 300 according to the invention. The body voltage generator circuit 300 provides a large loop gain by modifying certain elements of the body voltage generator circuit 200, shown in FIG. 2. For the purpose of the following analysis, it is assumed that the channel lengths of the transistor 320, which is the adaptive body bias device, and the transistor 340, which is the current reference device, are equal, and that the width of the transistor 340 is a times the width of the transistor 320, where a>1. For example, it can be assumed that the current mirror formed by the transistors 310 and 330 is 1:1. For analysis purposes, it is also assumed that the body voltage $V_B$ is initially '0'. Therefore:

$$I_{D330} < I_{D340} \quad (7)$$

and the drain voltage $V_{D340}$ of the transistor 340 decreases. Thus, the output of the inverter comprising the transistor 390 and the current source 380 increases. This increase is coupled through the source follower transistor 360, the current source 370, and ON switch transistor 350 to the body of the transistor 320, thus increasing its current. Equilibrium is achieved when:

$$I_{D320} = I_{D310} = I_{D330} = I_{D340} \quad (8)$$

which means, following the same reasoning provided with respect of the body voltage generator circuit 200 shown in FIG. 2, that:

$$I_{D320} \text{ with body bias} = a \times I_{D320} \text{ without body bias} \quad (9)$$

Hence, in the body voltage generator circuit 300 the CER is set to the desired value a. The extra inverter in the loop, i.e. the transistor 390 and current source 380, provides extra loop gain. A resistor 392 and a capacitor 394 are used to compensate the loop using standard feedback compensation practice to ensure stability, The W/L ratios in the above example are provided for illustration purposes only and are not meant to limit the scope of the invention. It will be apparent to those skilled in the art that ratios other than those set forth above can be used. For example, the current mirror consisting of the transistors 310 and 330 can have a current ratio different from 1, if the sizes of the transistors 320 and 340 are appropriately altered to maintain the desired CER. The W/L ratios of the transistors should satisfy:

$$[(W/L)_{340}/(W/L)_{320}] \times [(W/L)_{310}/(W/L)_{330}] = a \quad (10)$$

The current sources above can be implemented with transistors using standard design techniques.

The CER value a can be programmable or tunable. For example, one or more of the four transistors 320, 310, 330, and 340 can be comprised of a plurality of transistors connected in parallel, some of which may be placed out of service as may be required by connecting their gates to their sources. This can be done, for example, by selecting the appropriate connections through electronic switches (not shown) and/or a digital control (not shown). Thus, the CER can be varied or tuned as required, for example, responsive to process tolerances, temperature, and/or aging. Such CER variation can also be effected by injecting an appropriate current at the common drain node between the transistors 320 and 310 or the transistors 330 and 340, this current being an appropriate function of process tolerances, temperature, and aging, as required.

The output voltage $V_B$ of either of the body voltage generator circuits 200 and 300 feeds the body of one or more other NMOS transistors on the chip. Specifically, thousands of such transistors may be connected to such body voltage circuits to achieve the benefits of the invention. Therefore, the invention overcomes the problem of other approaches in prior art that either require a dedicated body voltage supply for each transistor, or that compromise by not providing the desired and necessary body voltage, as explained above. In fact, with regard to the invention a single body voltage $V_B$ generator can feed substantially all of the NMOS transistors throughout the chip if the degree of matching achieved is satisfactory. If matching is not satisfactory, the transistors in a given neighborhood can be fed by a body voltage $V_B$ generator that is provided specifically for these transistors, for example, by placing the voltage generator circuit in proximity to such transistors to ensure transistor matching. Different neighborhoods, then, have different body voltage $V_B$ generators.

The body bias generator circuits shown in FIGS. 2 and 3 can be used independently of the circuit shown in FIG. 1 to feed the body bias of other appropriate circuits.

A method is also disclosed herein for forming a circuit to control leakage of a MOS transistor. Accordingly, a MOS transistor is formed, the MOS transistor having a gate terminal, a drain terminal, a source terminal, and a body terminal. In accordance with the invention, a control circuit is coupled to the body terminal of the MOS transistor, such that the body receives a first reference potential in one instance and a second reference potential in another. By controlling the kind of potential provided to the transistor, it is possible to ensure that the leakage characteristics of the transistor are controlled. The control circuit is formed as explained in more detail herein above.

In one embodiment of the invention, the body voltage VB is tied to the supply voltage VDD. In such case, a level shifter adjusts the voltage levels to the desired voltage level in accordance with the principles discussed hereinabove. Such a level shifter may be connected between the supply voltage VDD and the drain terminal of the transistor 130 at location A in FIG. 1. In another embodiment, the level shifter is connected between the source of the transistor 130 and the drain of the transistor 140 at location B in FIG. 1. In yet another embodiment of the invention, a capacitor 150 may be connected between the gate and source of the transistor 130 for improved performance at transient times when the transistor 120 switches from ON to OFF or vice versa.

While the invention disclosed herein is described with respect to NMOS transistors, this should not be viewed as limiting the scope of the invention. A person skilled in the art would readily acknowledge that the invention can be adapted to operate with respect to PMOS transistor, and that such adaptation is straightforward and does not involve any undue burden in its implementation. Furthermore, the invention is described with respect to an inverter. However, other circuits may be used including, but without limitation, circuits such as NOR and NAND gates. The invention disclosed herein may also be used to reduce other leakage currents.

Although the invention is described herein with reference to the preferred embodiment, one skilled in the art will readily appreciate that other applications may be substituted for those set forth herein without departing from the spirit and scope of the present invention. Accordingly, the invention should only be limited by the Claims included below.

The invention claimed is:

1. A leakage control circuit for a logic gate, comprising:
a logic gate comprising a first N-type metal-oxide semiconductor (NMOS) transistor and a first P-type metal-oxide semiconductor (PMOS) transistor, each transistor having a body terminal, a drain terminal, a source terminal, and a gate terminal, and where at least the gate terminal of the first PMOS transistor and the gate terminal of the NMOS transistor are connected; and
a control circuit coupled to said logic gate via any of said first NMOS transistor and said PMOS transistor, said control circuit comprising:
a first metal-oxide semiconductor (MOS) transistor having a drain terminal connected to the body terminal of any of said first NMOS transistor and said first PMOS transistor to bring said body terminal to a first reference potential, and a gate terminal of said first MOS transistor connected to the drain terminal of any of said first NMOS transistor and said first PMOS transistor, wherein a body terminal of the first MOS transistor is grounded; and
a second MOS transistor having a source terminal connected to said body terminal of any of said first NMOS transistor and said first PMOS transistor to bring said body terminal to a second reference potential, and a gate terminal of said second MOS transistor connected to the gate terminal of any of said first NMOS transistor and said first PMOS transistor, said second reference potential provided by a positive body bias voltage supply connected to a drain terminal of the second MOS transistor and having a potential higher than a common ground for said NMOS transistor or a bias voltage supply having a potential lower than a common supply voltage of said PMOS transistor that provides a bias voltage to establish a predetermined current enhancement ratio (CER), wherein a body terminal of the second MOS transistor is grounded.

2. The circuit of claim 1, wherein said CER expresses a ratio between a current of said drain of any of said first NMOS transistor and said first PMOS transistor with body bias to a current of said drain of any of said first NMOS transistor and said PMOS transistor without body bias.

3. The circuit of claim 1, wherein said CER expresses a ratio of width over length of a reference current device and a width over length of an adaptive body bias device, multiplied by a ratio of width over length of a first transistor of a current mirror circuit of said body bias voltage supply and a second transistor of a current mirror circuit of said body bias voltage supply.

4. The circuit of claim 1, wherein the logic gate is any of an inverter, NAND, NOR, AND, OR, XOR, NXOR, AND-OR, and OR-AND.

5. A circuit, comprising:
a first metal-oxide semiconductor (MOS) transistor of a logic gate having a gate terminal, a source terminal, a drain terminal, and a body terminal, wherein at least the gate terminal of the first MOS transistor and a gate terminal of a second MOS transistor of the logic gate are connected, the second MOS transistor having an opposite polarity of that of the first MOS transistor; and
a control circuit coupled to said first MOS transistor, said control circuit comprising:
a third MOS transistor having a drain terminal connected to said body terminal of said first MOS transistor to bring said body terminal to a first reference potential supplied by a reference source connected to a source terminal of said third MOS transistor, and a gate terminal of said third MOS transistor connected to said drain terminal of said first MOS transistor, wherein a body terminal of the first MOS transistor is grounded; and
a fourth MOS transistor having a source terminal coupled to said body terminal of said first MOS transistor to bring said body terminal of said first MOS transistor to a second reference potential, and a gate terminal of said fourth MOS transistor connected to said gate terminal said first NMOS transistor, said second reference potential provided by a body bias voltage supply, connected to a drain terminal of the second MOS transistor, to establish a predetermined current enhancement ratio (CER), wherein a body terminal of the second MOS transistor is grounded;
said control circuit controlling leakage of said first MOS device.

6. The circuit of claim 5, wherein said CER expresses a ratio between a current of said drain of said second MOS transistor with body bias to a current of said drain of said second MOS transistor without body bias.

7. The circuit of claim 5, wherein said second MOS transistor is any of a P-type MOS (PMOS) transistor and an N-type MOS (NMOS) transistor.

8. The circuit of claim 5, wherein said CER expresses a ratio of width over length of a reference current transistor and a width over length of the first MOS transistor, multiplied by a ratio of width over length of a first transistor of a current mirror circuit of said body bias voltage supply and a second transistor of said current mirror circuit of said body bias voltage supply.

9. The circuit of claim 5, wherein said MOS device comprises a portion of a logic gate.

10. The circuit of claim 9, wherein said logic gate comprises any of an inverter, NAND, NOR, AND, OR, XOR, NXOR, AND-OR, and OR-AND.

11. A body voltage control circuit for controlling leakage of a metal-oxide semiconductor (MOS) transistor of a logic gate, comprising:
a first MOS transistor having a drain terminal connected to a body terminal of the MOS transistor to bring said body terminal of the MOS transistor to a first reference potential, and a gate terminal of said first MOS transistor connected to the drain terminal of said MOS transistor, wherein a body terminal of the MOS transistor is grounded;
a second MOS transistor having a source terminal connected to said body terminal of the MOS transistor of a logic gate to bring said body terminal of the MOS transistor of a logic gate to a second reference potential from a body bias voltage supply, and a gate terminal of said second MOS transistor connected to the gate terminal said MOS transistor of a logic gate, wherein a body terminal of the second MOS transistor is grounded; and
the body bias voltage supply connected to the drain of said second MOS transistor to establish a predetermined current enhancement ratio (CER).

12. The circuit of claim 11, wherein said CER expresses a ratio between a current of said drain of the MOS transistor with body bias to a current of said drain of the MOS transistor without body bias.

13. The circuit of claim 11, wherein the MOS transistor comprises any of a P-type MOS (PMOS) transistor and an N-type MOS (NMOS) transistor.

14. The circuit of claim 11, wherein said CER expresses a ratio of width over length of a reference current device and a width over length of an adaptive body bias device, multiplied by a ratio of width over length of a first transistor of a current mirror circuit of said body bias voltage supply and a second transistor of a current mirror circuit of said body bias voltage supply.

15. A method of manufacturing a leakage control circuit to control leakage of a metal-oxide semiconductor (MOS) transistor of a logic gate, comprising the steps of:
   forming the MOS transistor on a substrate, the MOS transistor having a gate terminal, a drain terminal, a source terminal, and a body terminal;
   forming a first MOS transistor having a drain terminal connected to said body terminal of the MOS transistor to bring said body terminal of the MOS transistor to a first reference potential, and a gate terminal of said first MOS transistor connected to the drain terminal of said MOS transistor, wherein a body terminal of the first MOS transistor is grounded; and
   forming a second MOS transistor of said logic gate having a source terminal coupled to said body terminal of the MOS transistor to bring said body terminal of the MOS transistor to a second reference potential, and a gate terminal of said first MOS transistor of said logic gate connected to the gate terminal of said MOS transistor, wherein a body terminal of the second MOS transistor is grounded;
   said second reference potential provided by a body bias voltage supply connected to a drain terminal of said second MOS transistor that provides a bias voltage to establish a predetermined current enhancement ratio (CER).

16. The method of claim 15, further comprising the step of:
   expressing said current enhancement ratio (CER) as a ratio between a current of said drain of the MOS transistor with body bias to a current of said drain of the MOS transistor without body bias.

17. The method of claim 15, further comprising the step of:
   expressing said CER as a ratio of width over length of a reference current device and a width over length of the MOS transistor, multiplied by a ratio of width over length of a first transistor of a current mirror circuit of said body bias voltage supply and a second transistor of a current mirror circuit of said body bias voltage supply.

18. The method of claim 15, said MOS transistor of said logic gate comprising any of a P-type MOS (PMOS) transistor and an N-type MOS (NMOS) transistor.

19. A method for controlling leakage current of a MOS transistor of a logic gate, said MOS transistor comprising a gate terminal, a drain terminal, a source terminal and a body terminal, the method comprising the steps of:
   supplying a first reference voltage to the body of the MOS transistor by a first MOS transistor having its drain connected to said body terminal of said MOS transistor and its gate connected to said drain terminal of said MOS transistor to bring the body terminal of the MOS transistor to a first reference potential;
   supplying a second reference potential to the body of the MOS transistor by a second MOS transistor having its source connected to said body terminal of said MOS transistor and its gate connected to said gate terminal of said MOS transistor to bring the body terminal of the MOS transistor to a second reference potential; and
   supplying a bias to a drain terminal of said second MOS transistor for said second reference potential to establish a predetermined current enhancement ratio (CER).

20. The method of claim 19, wherein said CER expresses a ratio between a current of said drain of the MOS transistor with body bias to a current of said drain of the MOS transistor without body bias.

21. The method of claim 19, wherein the MOS transistor comprises any of a P-type MOS (PMOS) transistor and an N-type MOS (NMOS) transistor.

22. The method of claim 19, wherein said CER expresses a ratio of width over length of a reference current device and width over length of the MOS transistor, multiplied by a ratio of width over length of a first transistor of a current mirror circuit of a body bias voltage supply and a second transistor of a current mirror circuit of said body bias voltage supply, said body bias voltage supply provided to said control circuit.

* * * * *